United States Patent
Northrup et al.

(10) Patent No.: US 6,583,449 B2
(45) Date of Patent: Jun. 24, 2003

(54) SEMICONDUCTOR DEVICE AND METHOD OF FORMING A SEMICONDUCTOR DEVICE

(75) Inventors: John E. Northrup, Palo Alto, CA (US); Christian G. Van de Walle, Sunnyvale, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/849,233

(22) Filed: May 7, 2001

(65) Prior Publication Data

US 2002/0163008 A1 Nov. 7, 2002

(51) Int. Cl.[7] .............................................. H01L 33/00
(52) U.S. Cl. .................. 257/102; 257/103; 257/101; 257/189; 257/18; 257/22; 257/615
(58) Field of Search ............................ 257/18, 22, 102, 257/103, 101, 189, 615

(56) References Cited

U.S. PATENT DOCUMENTS

| 3,836,999 A | * | 9/1974 | Nishizawa | 357/63 |
| 5,045,894 A | * | 9/1991 | Migita et al. | 357/17 |
| 5,116,455 A | * | 5/1992 | Daly | 156/605 |
| 5,139,960 A | * | 8/1992 | Chadi | 437/33 |

* cited by examiner

Primary Examiner—Nathan J. Flynn
Assistant Examiner—Remmon R. Fordé
(74) Attorney, Agent, or Firm—Oliff & Berridge, PLC (57) ABSTRACT

A semiconductor device includes group III-V layers formed over a substrate. At least one of the group III-V layers is doped with a dopant. The dopant includes a first dopant and one of a second dopant and an isovalent impurity. The first dopant has a covalent radius different in size than the covalent radii of each of the second dopant and the isovalent impurity.

59 Claims, 4 Drawing Sheets

SEMICONDUCTOR DEVICE AND METHOD OF FORMING A SEMICONDUCTOR DEVICE

BACKGROUND OF THE INVENTION

1. Field of Invention

This invention relates to doping semiconductor materials.

2. Description of Related Art

Group III-V semiconductors comprise elements selected from groups III and V of the periodic table. The group III nitride semiconductors, in particular, are used as light emitters for optoelectronic device applications. Group III nitride semiconductors can also be used for high-frequency, high-power, and/or high-temperature electronic devices. These types of semiconductors have the wide bandgap necessary for short-wavelength visible light emission. There are known group III nitride compounds and alloys comprising group III elements, such as Al, Ga and In, and the group V element N. These materials are deposited on substrates to produce layered structures usable in optoelectronic devices, including LEDs and laser diodes. These devices emit visible light over a wide range of wavelengths.

One such group III-V semiconductor is GaN. GaN is a wide-band-gap semiconductor that is used to fabricate blue-light emitting laser diodes. These laser diodes require a region with n-type doping and a region with p-type doping. N-type doping is usually achieved in GaN lasers by introducing Si atoms, which replace Ga atoms and act as donors. P-type doping is usually achieved in GaN lasers by introducing Mg atoms, which occupy the Ga sublattice sites and act as acceptors. An active region is located between the n-type region and the p-type region.

SUMMARY OF THE INVENTION

At present, doping levels in semiconductor materials are less than desired for efficient semiconductor device performance. For example, hole concentrations in GaN resulting from p-type doping are usually less than a few times $10^{18}$ cm$^{-3}$. Several factors may limit the hole concentration. One factor is the low solubility of the Mg atoms. Another factor is the high binding energy of the holes to the Mg acceptors.

This invention provides doped materials and methods for doping that compensate for local stress caused by dopant atoms having smaller or larger covalent radii than that of the atoms of the sublattice in a group III-V semiconductor material, such as a nitride semiconductor material.

This invention separately provides higher concentrations of dopant in a layer of a group III-V semiconductor material, such as a nitride semiconductor material.

This invention separately provides semiconductor devices having enhanced efficiency.

In various exemplary embodiments, the semiconductor structure according to this invention includes at least one first group III-V layer, such as a group III nitride layer, formed over a substrate. At least a portion of the at least one first group III-V layer is doped by one of an n-type dopant and a p-type dopant. An active layer is formed on or over the at least one first group III-V layer. At least one second group III-V layer is formed on or over the active layer. At least a portion of the at least one second group III-V layer is doped by the other one of the n-type dopant and the p-type dopant. A first electrode is formed on or over the at least one first group III-V layer, and a second electrode is formed on or over the at least one second group III-V layer. The p-type dopant includes a first p-type dopant and one or both of a second p-type dopant and an isovalent impurity. The first p-type dopant has a covalent radius different in size than that of the one of the second p-type dopant and/or the isovalent impurity. The first p-type dopant has a covalent radius that is one of less than or greater than the covalent radius of the base group III element, while the second p-type dopant and/or the isovalent impurity each have a covalent radius that is greater than or less than, respectively, the covalent radius of the base group III element.

The local stress caused by the first p-type dopant is compensated by the local stress caused by the second p-type dopant and/or the isovalent impurity. Because the local stress is reduced, the concentration of the first p-type dopant can be enhanced.

These and other features and advantages of this invention are described in, or are apparent from, the following detailed description of various exemplary embodiments of the systems and methods according to this invention

BRIEF DESCRIPTION OF THE DRAWINGS

The preferred embodiments of this invention will be described in detail, with reference to the following figures, wherein.

DETAILED DESCRIPTION OF PREFERRED EMBODIMENTS

It should be understood that the following description of exemplary embodiments of the invention can be directed to any type of known or later discovered semiconductor structure and material. However, the following exemplary embodiments of the invention are directed to nitride semiconductor materials and light-emitting device structures using nitride semiconductor materials. Specifically, the following description is directed to GaN semiconductor structures. However, it should be appreciated that the techniques set out in the following description can be directed to n-type or p-type doping of any known or later discovered semiconductor compound. For example, U.S. patent application Ser. No. 09/849,227 (Attorney Docket No. 109432), incorporated herein by reference in its entirety, is particularly directed to n-type doping.

In the following description, the terms "doping" and "dopant" should be interpreted to include the introduction of impurities, such as isovalent inpurities, into a semiconductor material and thus is not limited to introducing donor or acceptor materials.

Figure 1:
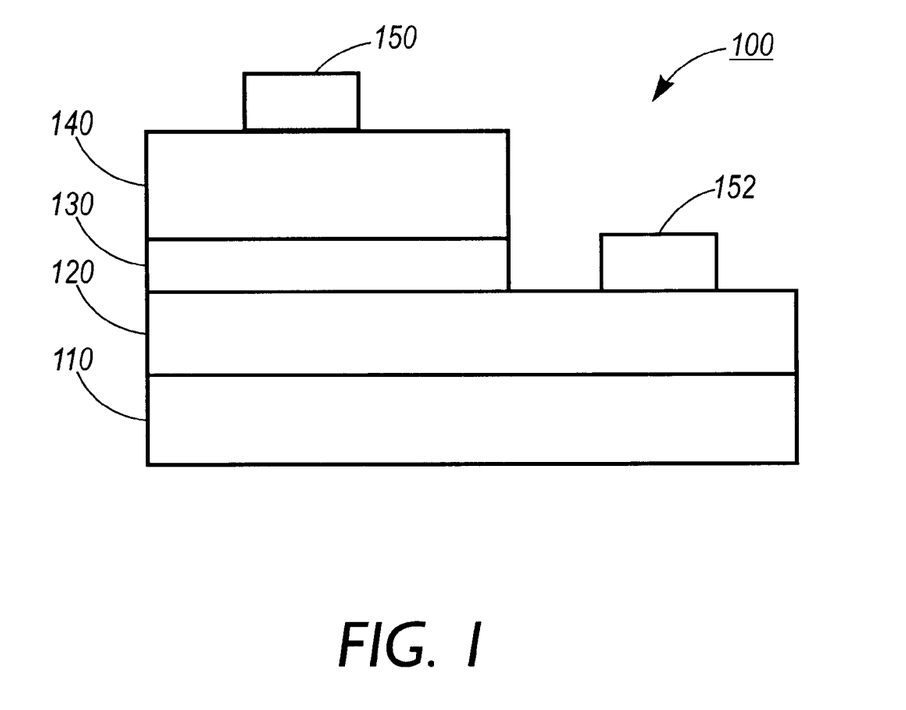
FIG. 1 shows the structure of a light-emitting device according to one exemplary embodiment of the invention.

FIG. 1 shows a multi-layered light-emitting device structure 100 according to one exemplary embodiment of the invention. The light-emitting device structure 100 includes a substrate 110, which may be formed by any known or later developed substrate material, such as, for example, sapphire or silicon carbide. In the case of sapphire, A and C-oriented single crystal sapphire is preferable for optoelectronic devices. A first group III nitride layer 120 is formed over the substrate 110. Group III nitrides, such as GaN, InGaN, and AlGaN, have the characteristic wide bandgap necessary for short-wavelength visible-light emission. At least a portion of the first group III nitride layer 120 shown in FIG. 1 is an n-type doped region. An active layer 130 is formed on or over the first group III nitride layer 120. Any suitable material can be used for the active layer, such as, for example, InGaN.

A second group III nitride layer 140 is then formed on or over the active layer 130. At least a portion of this second group III nitride layer 140 is a p-type doped region. A first electrode 150 is formed on or over the second group III nitride layer 140. A second electrode 152 is formed on or over the first group III nitride layer 120. The resulting structure shown in FIG. 1 thus includes the active layer 130, which is confined between the p-type group III nitride region 140 and the n-type group III nitride region 120.

In operation, an electric potential is applied across the first electrode 150 and the second electrode 152. Electrons in the conduction band flow from the n-doped group III nitride layer 120 to a lower energy state in the active layer 130. The voltage applied at the first electrode 150 causes holes in the valence band of the p-doped group III nitride layer 140 to flow into the active layer 130. Thus, electrons from the n-doped group III nitride layer 120 combine with holes from the p-doped group III nitride layer 140 in the active layer 130. Recombination of holes and electrons in the active layer 130 results in the emission of light.

Multiple confinement and contact layers can be provided within the light-emitting device structure 100. Thus, the first and second group III nitride layers 120 and 140 are illustrative and are not meant to limit the number of group III nitride layers which may be formed within the light-emitting device structure 100.

P-type doping has been achieved in GaN semiconductors by doping with Mg atoms. However, less than desired hole concentrations have been achieved with Mg doping.

In one exemplary embodiment of a group III-V material usable with this invention, a GaN semiconductor is p-doped with Be and co-doped with another p-dopant that has a larger covalent radius than that of Be. Computational results [J. Neugebauer and C. G. Van de Walle, J. Appl. Phys. 85, 3003 (1999)] have shown that the solubility of Be in GaN is larger than that of Mg, and the ionization energy of Be is slightly lower than that of Mg.

The formation energy directly determines the solubility of a substitutional acceptor. The formation energy, in turn, is affected by the strength of the bonding with the substitutional acceptor's nearest neighbors, and the size of the substitutional acceptor relative to the atom the substitutional acceptor replaces. In the case of an acceptor substituting on the group III site, the nearest neighbors are the group V atoms. Thus, the bond strength of Be can be estimated by the heat of formation of $Be_3N_2$. $Be_3N_2$ has a much larger heat of formation than that of $Mg_3N_2$. The stronger Be—N bond, in comparison to Mg—N, favorably affects the solubility of Be compared to Mg in nitride-based group III-V semiconductors.

However, the relatively low formation energy of Be is counteracted by the relatively small covalent radius of Be. Be has a much smaller covalent radius than the covalent radius of Ga. Thus, using Be as a p-dopant results in local strain in the Ga—N lattice due to sizable relaxation of the nearest N neighbors. The local strain caused by the Be atoms is energetically costly and raises the formation energy of the Be atoms on the Ga sites. As a result, the Be formation energy in GaN doped solely with Be is actually only slightly lower than that of Mg. Thus, concentrations of Be on the Ga sites remain relatively low.

According to one exemplary embodiment of the group III-V material according to this invention, higher concentrations of Be in the Ga lattice are achieved by introducing at least one second larger size p-dopant and/or isovalent impurity into the Ga sites of the Ga—N lattice. In general, the at least one second p-dopant and/or isovalent dopant or impurity has a covalent radius that is larger than the first p-type dopant. This is especially useful when the first p-type dopant has a covalent radius that is smaller than the covalent radius of the base group III element. In this case, in various exemplary embodiments, the at least one second p-type dopant and/or covalent dopant or impurity can have a covalent radius that is larger than the covalent radius of the base group III element. The small size of the Be atom is thus compensated for by the larger size of another dopant in its vicinity. The stress compensation of the larger-sized atoms will result in a lower formation energy of the dopant complex. This, in turn, results in higher concentrations of Be in the Ga lattice.

Alternatively, in another exemplary embodiment, the at least one second p-type dopant and/or isovalent dopant or impurity has a covalent radius that is smaller than the first p-type dopant. This is especially useful when the first p-type dopant has a covalent radius that is larger than the covalent radius of the base group III element. In this case, in various exemplary embodiments, the at least one second p-type dopant and/or isovalent dopant or impurity can have a covalent radius that is also smaller than the covalent radius of the base group III element.

Figure 8:
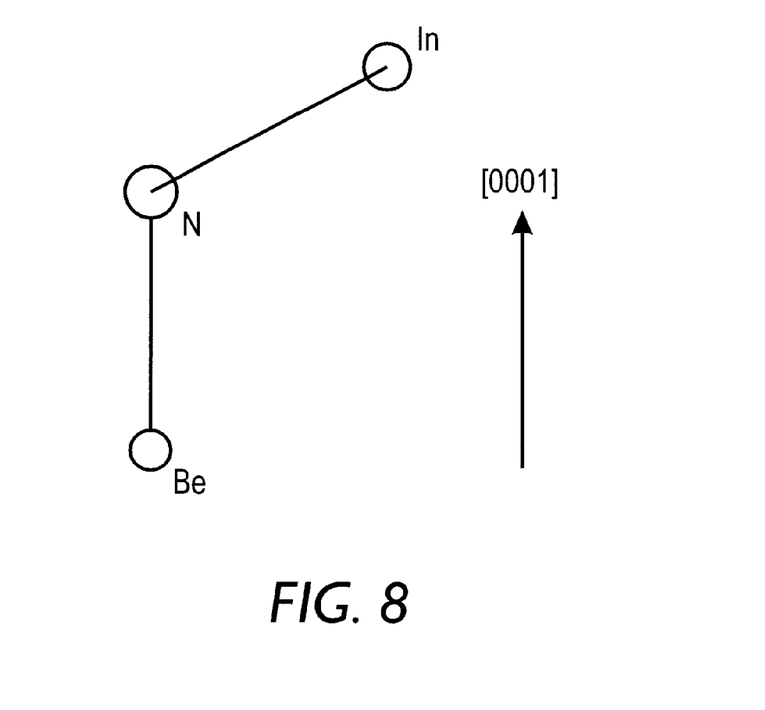
FIG. 8 shows an example of a Be—N—In complex according to this invention.

According to one exemplary embodiment of a group III-V material according to this invention, the isovalent impurity, introduced as a dopant along with Be, is In. The formation energy of a complex including a Be atom with one or more In atoms located in second-nearest-neighbor positions is lower than that of an isolated Be atom. The reduction in formation energy by the addition of In enhances the concentration of Be in the Ga lattice. An example of a Be—N—In complex is shown in FIG. 8.

According to a second exemplary embodiment of the group III-V material according to this invention, the GaN semiconductor is doped with a small group-II acceptor and co-doped with a larger group-II acceptor. An example of a suitable small group-II acceptor is Be. An example of a suitable large group-II acceptor is Mg. The Be and Mg atoms in the Ga lattice form a Be—N—Mg complex. The Be—N—Mg complex is a double acceptor complex.

According to a third exemplary embodiment of the group III-V material according to this invention, the GaN semiconductor is doped with a large group-II acceptor and co-doped with a small group-III isovalent impurity. An example of a suitable large group-II acceptor is Mg. An example of a suitable small group-III isovalent impurity is Al. The Mg and Al atoms in the Ga lattice form a Mg—N—Al complex. The Mg—N—Al complex is a single acceptor complex.

According to a fourth exemplary embodiment of the group III-V material according to this invention, the GaN semiconductor is doped with a small group-II acceptor and co-doped with a large group-V isovalent impurity. An example of a suitable small group-II acceptor is Be. An example of a suitable large group-V isovalent impurity is P. The Be and P atoms in the Ga lattice form a Be—P complex. The Be—P complex is a single acceptor complex.

The above exemplary embodiments of the group III-V material according to this invention are not meant to be limiting. The doped materials and doping methods according to this invention are intended to encompass any combination of dopant and co-dopant in a region of a group III-V semiconductor material that results in stress compensation in a doped group III-V layer or region of the group III-V semiconductor material. The doped materials and doping methods according to this invention can be applied to any known or later discovered semiconductor compound, such as, for example, GaAs and InP.

Thus, according to a fifth exemplary embodiment of the group III-V material according to this invention, a GaAs semiconductor is p-doped with Be and co-doped with In on the Ga site, or Sb on the As site. According to a sixth exemplary embodiment of the group III-V material according to this invention, an InP semiconductor is p-doped with Be and As isovalent impurities are introduced on the P site.

The doped materials and doping methods according to this invention can also be used to enhance the concentration of n-type dopants in a region of a group III-V semiconductor. Thus, according to a seventh exemplary embodiment, a GaAs semiconductor is n-doped with Te and co-doped with a smaller sized co-dopant, such as, for example, S, on the As site. Alternatively, P isovalent impurities can be introduced on the As sublattice, or B isovalent impurities can be introduced on the Ga site to compensate for the local stress caused by the larger Te atoms.

FIGS. 2–8 illustrate the various steps of a first exemplary embodiment of a method of forming an optoelectronic device according to this invention.

Figure 2:
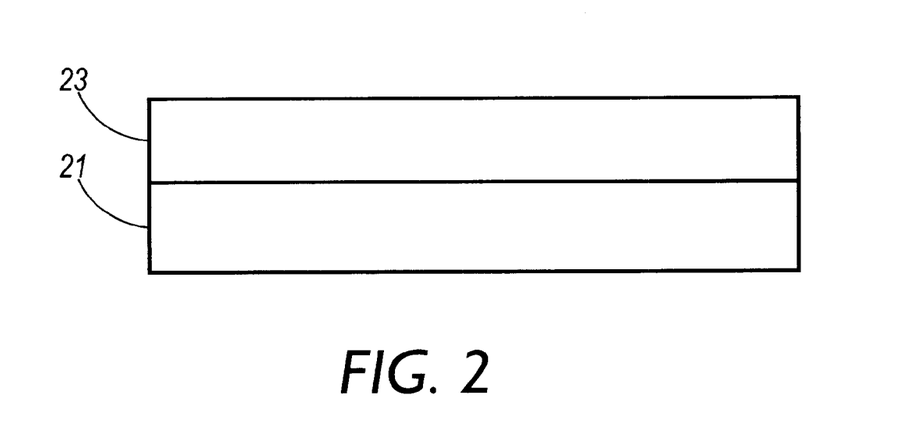
FIG. 2 illustrates a first step of one exemplary embodiment of a method of forming an optoelectronic device according to this invention.

FIG. 2 illustrates a first step of the first exemplary embodiment of the method of forming an optoelectronic device according to this invention. In this first step, an n-type group III-V layer 23 is epitaxially grown on or over a sapphire substrate 21. The n-type group III-V layer 23 is grown on or over the sapphire substrate 21 by any suitable method, such as by metal-organic chemical vapor deposition (MOCVD). In this exemplary embodiment, the n-type layer group III-V layer 23 is n-type GaN. The n-type group III-V layer 23 is doped with any suitable n-type dopant, such as, for example, Si.

Figure 3:
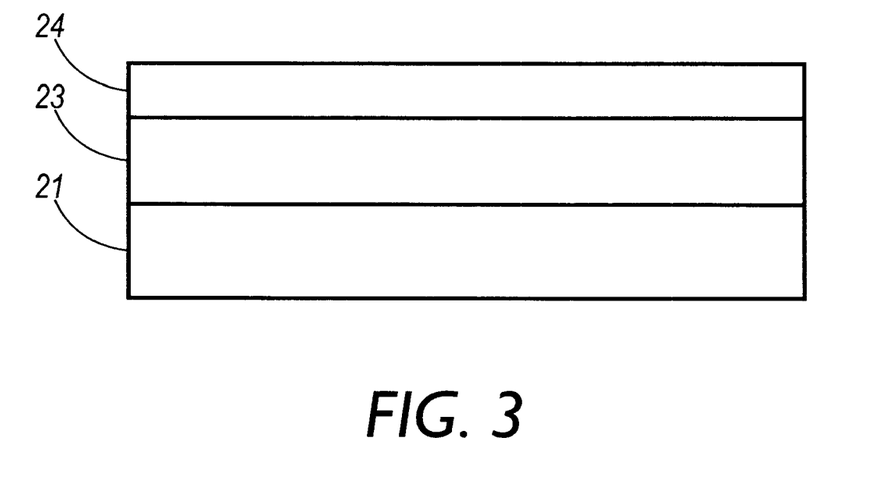
FIG. 3 illustrates a second step of one exemplary embodiment of a method of forming an optoelectronic device according to this invention.

FIG. 3 illustrates a second step of the first exemplary embodiment of the method of forming an optoelectronic device according to this invention. In this second step, an active layer 24 is grown on or over the n-type group III-V layer 23. The active layer 24 includes any suitable material, such as, for example, InGaN.

Figure 4:
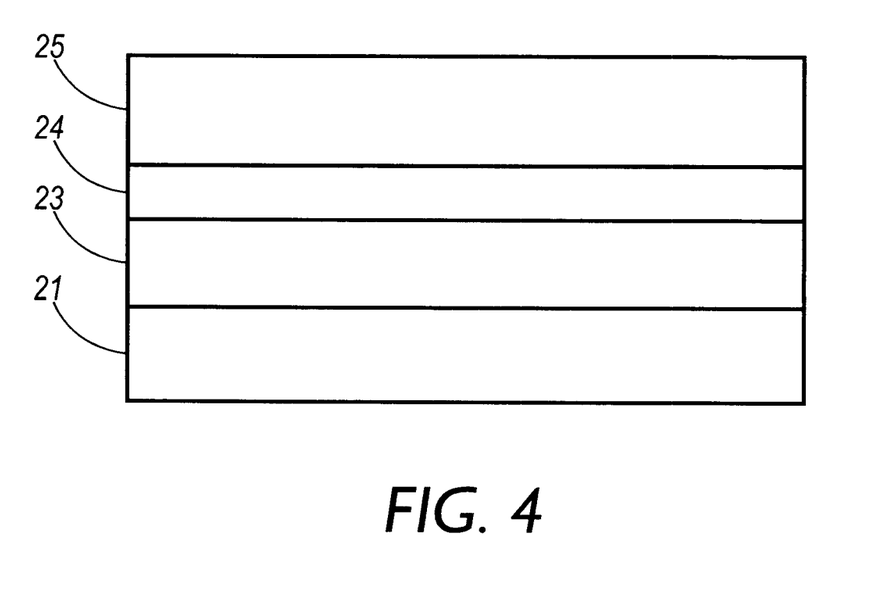
FIG. 4 illustrates a third step of one exemplary embodiment of a method of forming an optoelectronic device according to this invention.

FIG. 4 illustrates a third step of the first exemplary embodiment of the method of forming an optoelectronic device according to this invention. In this third step, a p-type group III-V layer 25 is grown on or over the active layer 24. In this exemplary embodiment, the p-type group III-V layer 25 is GaN. The p-type group III-V layer is doped with a first acceptor and co-doped with a second dopant and/or isovalent impurity. The first acceptor has a covalent radius that is different than the covalent radius of the group III atoms that make up the p-type group III-V layer 25 sublattice. If the covalent radius of the first acceptor is smaller than the covalent radius of the group III atoms, the second dopant and/or isovalent impurity has, in various exemplary embodiments, a larger covalent radius than the covalent radius of the first acceptor. In various other exemplary embodiments, the second dopant or isovalent impurity can have a covalent radius that is larger than the covalent radius of the group III atoms that make up the p-type group III-V layer 25 sublattice. In this case, the smaller first acceptor atoms are under a local tensile stress in the p-type group III-V layer 25 sublattice. The larger second dopant and/or isovalent impurity atoms are under a local compressive stress in the p-type group III-V layer 25 sublattice. In either case, the complex comprising the first acceptor and second dopant and/or isovalent impurity is stress-compensated, resulting in enhanced concentration of the acceptors in the p-type group III-V layer 25 sublattice.

Similarly, if the covalent radius of the first acceptor is larger than the covalent radius of the group III atoms, the second dopant and/or isovalent impurity has, in various exemplary embodiments, a smaller covalent radius than the covalent radius of the first acceptor. In various other exemplary embodiments, the second dopant and/or isovalent impurity can have a covalent radius that is smaller than the covalent radius of the group III atoms that make up the p-type group III-V layer 25 sublattice. In this case, the larger first acceptor atoms are under a local compressive stress in the p-type group III-V layer 25 sublattice. The smaller second dopant and/or isovalent impurity atoms are under a local tensile stress in the p-type group III-V layer 25 sublattice. In either case, the complex comprising the first acceptor and second dopant and/or impurity is stress compensated, resulting in enhanced concentration of the acceptors in the p-type group III-V layer 25 sublattice.

In one exemplary embodiment, the p-type group III-V layer 25 is doped with Be and co-doped with In. The co-doping of the p-type group III-V layer 25 with In is easily accomplished because an In source is readily available from the active layer 24. Since the desired effects rely on local stress compensation around the Be atom, approximately one In atom, or more, should be provided for every Be atom. The desired concentration of In atoms is thus on the order of the acceptor concentration. However, the relative doping concentration is not limited to this relationship, and thus can have any relative doping concentration that provides sufficient stress compensation for the intended uses of the resulting material.

Figure 5:
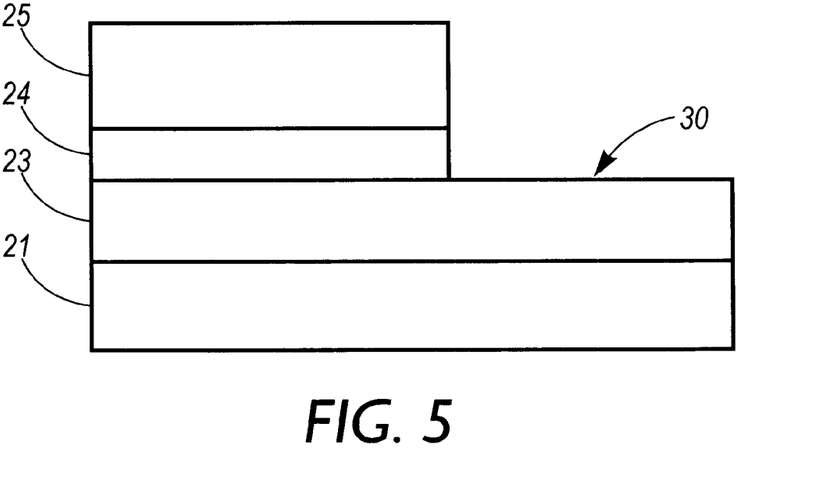
FIG. 5 illustrates a fourh step of one exemplary embodiment of a method of forming an optoelectronic device according to this invention.

FIG. 5 illustrates a fourth step of the first exemplary embodiment of the method of forming an optoelectronic device according to this invention. In this fourth step, portions of the active layer 24 and the p-type group III-V layer 25 are patterned and/or removed to form an exposed portion 30 of the n-type group III-V layer 23. Removing the portions of the active layer 24 and the p-type group III-V layer 25 to form the exposed portion 30 of the n-type group III-V layer 23 can be accomplished by any suitable method, such as, for example, etching.

Figure 6:
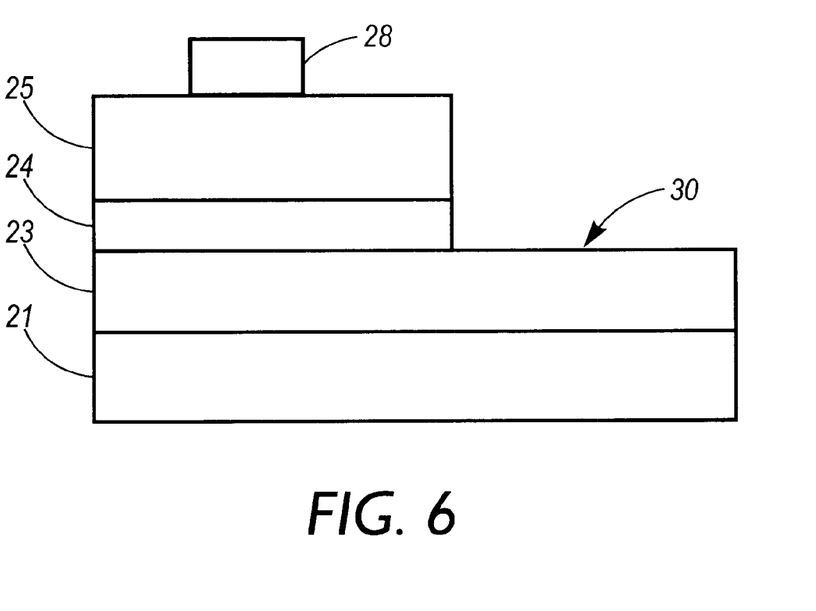
FIG. 6 illustrates a fifth step of one exemplary embodiment of a method of forming an optoelectronic device according to this invention.

FIG. 6 illustrates a fifth step of the first exemplary embodiment of the method of forming an optoelectronic device according to this invention. In this fifth step, a first electrode 28 is formed on or over the p-type group III-V layer 25. The first electrode 28 includes any suitable material, such as, for example, Ti and Al. The first electrode 28 is formed on or over the p-type group III-V layer 25 by any suitable method, such as, for example, a process that includes evaporating and sintering of the material used to form the first electrode 28.

Figure 7:
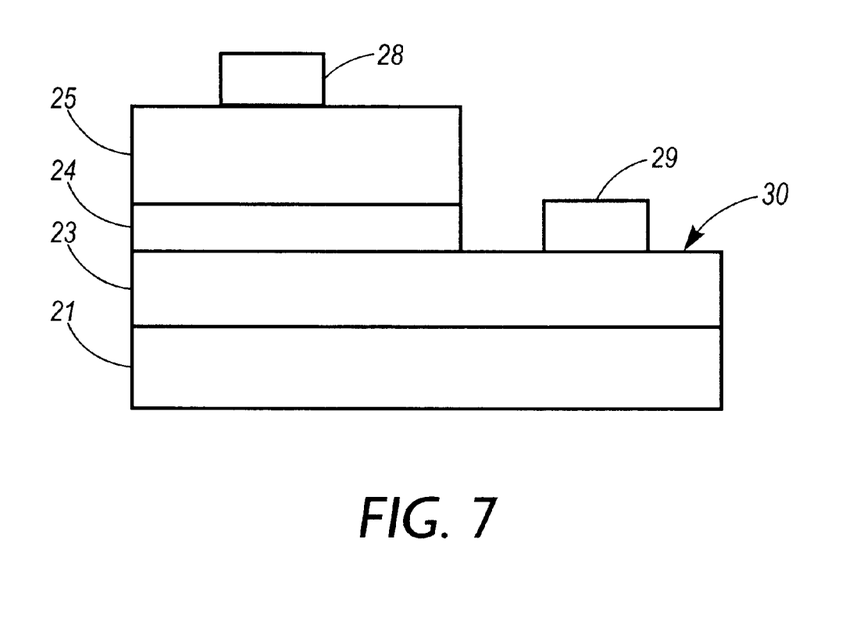
FIG. 7 illustrates a sixth step of one exemplary embodiment of a method of forming an optoelectronic device according to this invention.

FIG. 7 illustrates a sixth step of the first exemplary embodiment of the method of forming an optoelectronic device according to this invention. In this sixth step, an second electrode 29 is formed on or over the exposed portion 30 of the n-type group III-V layer 23. The second electrode 29 includes any suitable material, such as, for example, Ti and Al. The second electrode 29 can be formed on or over the exposed portion 30 of the n-type group III-V layer by any suitable method, such as, for example, a process that includes evaporating and sintering of the material used to form the second electrode 28.

In some, but not all, exemplary embodiments, the n-type group III-V layer 23 layer is doped with a first donor and co-doped with a second dopant and/or isovalent impurity. The first donor has a covalent radius that is different than the covalent radius of the group V atoms that make up the n-type group III-V layer 23 sublattice. If the covalent radius of the first donor is smaller than the covalent radius of the group V atoms, the second dopant and/or isovalent impurity has, in various exemplary embodiments, a larger covalent radius than the covalent radius of the first donor. In various other exemplary embodiments, the second dopant or isovalent impurity can have a covalent radius that is larger than the covalent radius of the group V atoms that make up the n-type group III-V layer 23 sublattice. In this case, the smaller first donor atoms are under a local tensile stress in the n-type group III-V layer 23 sublattice. The larger second dopant and/or isovalent impurity atoms are under a local compressive stress in the n-type group III-V layer 23 sublattice. In either case, the complex comprising the first donor and second dopant and/or isovalent impurity is stress-compensated, resulting in enhanced concentration of the donors in the n-type group III-V layer 23 sublattice.

Similarly, if the covalent radius of the first donor is larger than the covalent radius of the group V atoms, the second dopant and/or isovalent impurity has, in various exemplary embodiments, a smaller covalent radius than the covalent radius of the first donor. In various other exemplary embodiments, the second dopant and/or isovalent impurity can have a covalent radius that is smaller than the covalent radius of the group V atoms that make up the n-type group III-V layer 23 sublattice. In this case, the larger first donor atoms are under a local compressive stress in the n-type group III-V layer 23 sublattice. The smaller second dopant and/or isovalent impurity atoms are under a local tensile stress in the n-type group III-V layer 23 sublattice. In either case, the complex comprising the first donor and second dopant and/or impurity is stress-compensated, resulting in enhanced concentration of the donors in the n-type group III-V layer 23 sublattice.

In one exemplary embodiment, the n-type group III-V layer 23 is GaAs. The n-type group III-V layer is doped with Te and co-doped with a smaller sized co-dopant, such as, for example, S, on the As site. Alternatively, P isovalent impurities can be introduced on the As sublattice, or B isovalent impurities can be introduced on the Ga site to compensate for the local stress caused by the larger Te atoms.

It should be appreciated that, in various exemplary semiconductor structures, when a p-type layer or region is doped according to this invention, it is not necessary to dope any related n-type layer or region according to this invention. Likewise, in some exemplary semiconductor structures, when an n-type layer or region is doped according to this invention, it is not necessary to dope any related p-type layer or region according to this invention. However, in some exemplary semiconductor structures, it may be desirable to dope both the n-type and the p-type layers and/or regions according to this invention.

The exemplary embodiments of the methods of doping semiconductor material according to this invention results in a higher concentration of doping atoms in the doped region or layer of a group III-V compound semiconductor material. Higher concentrations of the acceptor or donor atoms in the corresponding region of a group III-V semiconductor results in improved device efficiency. For example, the exemplary embodiments of the methods of doping semiconductor material according to this invention provides improved efficiency of electronic devices, such as, for example, transistors, optoelectronic devices, diodes, laser diodes and light emitting diodes. Further, the exemplary embodiments of the methods of doping semiconductor material according to this invention provides improved efficiency of electronic systems that incorporate such electronic devices, such as, for example, display devices, image forming devices, facsimile machines, laser printers, fiber-optic networks, microprocessors, gate arrays, and digital signal processors.

While this invention has been described in conjunction with the specific exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A semiconductor material, comprising:
   at least one group III-V region doped by a p-type dopant;
   wherein the p-type dopant includes a first p-type dopant and a second p-type dopant, the first p-type dopant having a covalent radius different in size than a covalent radius of the second p-type dopant, such that a local stress in the at least one group III-V region caused by the first p-type dopant is compensated by a local stress in the at least one group III-V region caused by the second p-type dopant, such that a concentration of the first p-type dopant in the at least one group III-V region is enhanced.

2. The semiconductor material of claim 1, wherein the at least one group III-V region is at least one of GaAs and InP.

3. The semiconductor material of clam 1, wherein the at least one group III-V region is a group III nitride region.

4. The semiconductor material of claim 3, wherein the group III nitride region is GaN.

5. The semiconductor material of claim 1, wherein the first p-type dopant is a relatively small covalent radius group-II acceptor and the second p-type dopant is a relatively large covalent radius group-II acceptor.

6. The semiconductor material of claim 5, wherein the first p-type dopant has a smaller covalent radius than the covalent radius of group III atoms in the at least one group III-V region, and the second p-type dopant has a larger covalent radius than the covalent radius of group III atoms in the at least one group III-V region.

7. The semiconductor material of claim 6, wherein the first p-type dopant is Be and the second p-type dopant is Mg.

8. The semiconductor material of claim 1, wherein the p-type further dopant comprises an isovalent impurity.

9. The semiconductor material of claim 8, wherein the first p-type dopant is Be and the isovalent impurity is In.

10. The semiconductor material of claim 8, wherein the first p-type dopant is a relatively large covalent radius group II acceptor and the isovalent impurity is a relatively small covalent radius group III isovalent impurity.

11. The semiconductor material of claim 10, wherein the first p-type dopant has a larger covalent radius than the covalent radius of group III atoms in the at least one group III-V region, and the isovalent impurity has a smaller covalent radius than the covalent radius of group III atoms in the at least one group III-V region.

12. The semiconductor material of claim 11, wherein the first p-type dopant is Mg and the isovalent impurity is Al.

13. The semiconductor material of claim 8, wherein the first p-type dopant is a relatively small covalent radius group II acceptor and the isovalent impurity is a relatively large covalent radius group V isovalent impurity.

14. The semiconductor material of claim 13, wherein the first p-type dopant has a smaller covalent radius than the covalent radius of group III atoms of the at least one group III-V region, and the group V isovalent impurity has a larger covalent radius than the covalent radius of group III atoms of the at least one group III-V region.

15. The semiconductor material of claim 14, wherein the first p-type dopant is Be and the isovalent impurity is at least one of P, Sb and As.

16. An electronic device containing the semiconductor material of claim 1.

17. The electronic device of claim 16, wherein the electronic device is one of a transistor, an optoelectronic device, a diode, a laser diode and a light emitting diode.

18. An electronic system, containing at least one electronic device of claim 17.

19. The electronic system of claim 18, wherein the electronic system is at least one of a display device, an image forming device, a facsimile machine, a laser printer, a fiber-optic network, a microprocessor, a gate array, and a digital signal processor.

20. A semiconductor structure, comprising:
   a substrate;
   at least one first group III-V region formed in, on or over the substrate, at least a portion of the at least one first group III-V region doped by one of an n-type dopant and a p-type dopant;
   at least one second group III-V region formed in, on or over the substrate, at least a portion of the at least one second group III-V region doped by the other one of the n-type dopant and the p-type dopant;
   wherein the p-type dopant includes a first p-type dopant and a second p-type dopant, the first p-type dopant having a covalent radius different in size than a covalent radius of the second p-type dopant, such that a local stress in the first or second group III-V region caused by the first p-type dopant is compensated by a local stress in the first or second group III-V region caused by the second p-type dopant, such that a concentration of the first p-type dopant in the first or second group III-V region is enhanced.

21. The semiconductor structure of claim 20, further comprising:
   a first electrode formed on or over the at least one first group III-V region; and
   a second electrode formed on or over the at least one second group III-V region.

22. The semiconductor structure of claim 20, wherein at least one of the at least one first group III-V region and the at least one second group III-V region is GaAs.

23. The semiconductor structure of claim 20, wherein at least one of the at least one first group III-V region is InP and the at least one second group III-V region is InP.

24. The semiconductor structure of claim 20, wherein at least one of the at least one first group III-V region and the at least one second group III-V region is a group III nitride region.

25. The semiconductor structure of claim 24, wherein at least one of the group III nitride regions is GaN.

26. The semiconductor structure of claim 20, wherein the first p-type dopant is a relatively small covalent radius group-II acceptor and the second p-type dopant is a relatively large covalent radius group-II acceptor.

27. The semiconductor structure of claim 26, wherein the first p-type dopant has a smaller covalent radius than the covalent radius of group III atoms in the first or second group III-V region, and the second p-type dopant has a larger covalent radius than the covalent radius of group III atoms in the first or second group III-V region.

28. The semiconductor structure of claim 26, wherein the first p-type dopant is Be and the second p-type dopant is Mg.

29. The semiconductor structure of claim 20, wherein the p-type further dopant comprises an isovalent impurity.

30. The semiconductor structure of claim 29, wherein the first p-type dopant is Be and the isovalent impurity is In.

31. The semiconductor structure of claim 29, wherein the first p-type dopant is a relatively large covalent radius group II acceptor and the isovalent impurity is a relatively small covalent radius group III isovalent impurity.

32. The semiconductor structure of claim 31, wherein the first p-type dopant has a larger covalent radius than the covalent radius of group III atoms in the first or second group III-V region, and the isovalent impurity has a smaller covalent radius than the covalent radius of group III atoms in the first or second group III-V region.

33. The semiconductor structure of claim 29, wherein the first p-type dopant is Mg and the isovalent impurity is Al.

34. The semiconductor structure of claim 29, wherein the first p-type dopant is a relatively small covalent radius group II acceptor and the isovalent impurity is a relatively large covalent radius group V isovalent impurity.

35. The semiconductor structure of claim 34, wherein the first p-type dopant has a smaller covalent radius than the covalent radius of group III atoms of the first or second group III-V region, and the isovalent impurity has a larger covalent radius than the covalent radius of group V atoms of the first or second group III-V region.

36. The semiconductor structure of claim 35, wherein the first p-type dopant is Be and the isovalent impurity is at least one of P, Sb and As.

37. An electronic device containing the semiconductor structure of claim 20.

38. The electronic device of claim 37, wherein the electronic device is one of a transistor, an optoelectronic device, a diode, a laser diode and a light emitting diode.

39. An electronic structure, containing at least one electronic device of claim 38.

40. The electronic system of claim 39, wherein the electronic system is at least one of a display device, an image forming device, a facsimile machine, a laser printer, a fiber-optic network, a microprocessor, a gate array, and a digital signal processor.

41. The semiconductor structure of claim 20, further comprising an active region formed on or over the at least one first group III-V region, wherein the second group III-V region is a group III-V layer formed on or over the active layer.

42. The semiconductor structure of claim 41, wherein the active region is InGaN.

43. A method of doping a group III-V semiconductor material, comprising:

doping at least one region in the group III-V semiconductor material with a first p-type dopant and a second p-type dopant, wherein the first p-type dopant has a covalent radius different in size than a covalent radius of the second p-type dopant, such that a local stress in the at least one group III-V region caused by the first p-type dopant is compensated by a local stress in the at least one group III-V region caused by the second p-type dopant, such that a concentration of the first p-type dopant in the at least one group III-V region is enhanced.

44. The method of forming a semiconductor material of claim 43, wherein the step of forming at least one group III-V region comprises forming at least one of at least one region of GaAs and at least one region of InP.

45. The method of forming a semiconductor material of claim 43, wherein the step of forming at least one group III-V region comprises forming at least one group III nitride region.

46. The method of forming a semiconductor material of claim 45, wherein the step of forming at least one group III nitride region comprises forming at least one region of GaN.

47. The method of forming a semiconductor material of claim 43, wherein the first p-type dopant is a relatively small covalent radius group-II acceptor and the second p-type dopant is a relatively large covalent radius group-II acceptor.

48. The method of forming a semiconductor material of claim 47, wherein the first p-type dopant has a smaller covalent radius than the covalent radius of group III atoms in the at least one group III-V semiconductor material, and the second p-type dopant has a larger covalent radius than the covalent radius of group III atoms in the at least one group III-V semiconductor material.

49. The method of forming a semiconductor material of claim 48, wherein the first p-type dopant is Be and the second p-type dopant is Mg.

50. The method of forming a semiconductor material of claim 43, wherein the p-type dopant further comprises an isovalent impurity.

51. The method of forming a semiconductor material of claim 50, wherein the first p-type dopant is Be and the isovalent impurity is In.

52. The method of forming a semiconductor material of claim 50, wherein the first p-type dopant is a relatively large covalent radius group II acceptor and the isovalent impurity is a relatively small covalent radius group III isovalent impurity.

53. The method of forming a semiconductor material of claim 52, wherein the first p-type dopant has a larger covalent radius than the covalent radius of group III atoms in the at least one group III-V semiconductor material, and the isovalent impurity has a smaller covalent radius than the covalent radius of group III atoms in the at least one group III-V semiconductor material.

54. The method of forming a semiconductor material of claim 53, wherein the first p-type dopant is Mg and the isovalent impurity is Al.

55. The method of forming a semiconductor material of claim 54, wherein the first p-type dopant has a smaller covalent radius than the covalent radius of group III atoms of the at least one group III-V semiconductor material, and the isovalent impurity has a larger covalent radius than the covalent radius of group V atoms of the at least one group III-V semiconductor material.

56. The method of forming a semiconductor structure of claim 55, wherein the first p-type dopant is Be and the isovalent impurity is at least one of P, Sb and As.

57. The method of forming a semiconductor material of claim 50, wherein the first p-type dopant is a relatively small covalent radius group II acceptor and the isovalent impurity is a relatively large covalent radius group V isovalent impurity.

58. A method of forming a semiconductor structure, comprising:

forming at least one first group III-V region in, on or over a substrate;

doping at least a region of the at least one first group III-V region with one of an n-type dopant and a p-type dopant;

forming at least one second group III-V region in, on or over the substrate;

doping at least a region of the at least one second group III-V region with the other of the n-type dopant and the p-type dopant;

wherein doping the one of the first and second group III-V regions with the p-type dopant comprises the doping steps of claim 43.

59. A method of forming a semiconductor structure, comprising:

forming at least one first group III-V layer over a substrate;

doping at least a region of the at least one first group III-V layer with one of an n-type dopant and a p-type dopant;

forming an active layer over the at least one first group III-V layer;

forming at least one second group III-V layer over the active layer;

doping at least a region of the at least one second group III-V layer with the other of the n-type dopant and the p-type dopant;

wherein doping the one of the first and second group III-V layers with the p-type dopant comprises the doping steps of claim 45.

* * * * *